United States Patent
Joo et al.

(10) Patent No.: US 6,677,217 B2
(45) Date of Patent: Jan. 13, 2004

(54) METHODS FOR MANUFACTURING INTEGRATED CIRCUIT METAL-INSULATOR-METAL CAPACITORS INCLUDING HEMISPHERICAL GRAIN LUMPS

(75) Inventors: Jae-hyun Joo, Seoul (KR); Wan-don Kim, Kyungki-do (KR); Seok-jun Won, Seoul (KR); Soon-yeon Park, Daegu (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/180,277

(22) Filed: Jun. 26, 2002

(65) Prior Publication Data

US 2003/0011013 A1 Jan. 16, 2003

(30) Foreign Application Priority Data

Jun. 26, 2001 (KR) ........................................ 2001-36584

(51) Int. Cl.[7] .............................................. H01L 21/20
(52) U.S. Cl. ..................... 438/398; 438/239; 438/255; 438/386; 438/393; 438/396; 438/665
(58) Field of Search ................................ 438/239, 240, 438/243, 250, 253, 255, 386, 387, 393, 396, 398, 650, 656, 648, 660, 665

(56) References Cited

U.S. PATENT DOCUMENTS

| 5,122,477 | A | * | 6/1992 | Wolters et al. ............. 438/396 |
| 5,529,958 | A | * | 6/1996 | Yaoita ........................ 438/656 |
| 5,736,422 | A | * | 4/1998 | Lee et al. ................... 438/660 |
| 5,789,268 | A | * | 8/1998 | Chivukula et al. .......... 438/240 |
| 5,801,413 | A |   | 9/1998 | Pan |
| 5,882,979 | A |   | 3/1999 | Ping et al. |
| 6,015,986 | A |   | 1/2000 | Schuegraf |
| 6,159,793 | A |   | 12/2000 | Lou |
| 6,472,319 | B2 | * | 10/2002 | Won et al. .................. 438/660 |
| 6,518,179 | B1 | * | 2/2003 | Joo ........................... 438/665 |

FOREIGN PATENT DOCUMENTS

| JP | 2000208440 | 7/2000 |
| KR | 1020000044608 | 7/2000 |
| KR | 2002-0050422 | 6/2002 |

OTHER PUBLICATIONS

Notice to Submit Response, Korean App. 10–2001–0036584, Mar. 31, 2003.
Joo et al, U.S. application Ser. No. 10/013,577, filed Dec. 11, 2001.

* cited by examiner

*Primary Examiner*—Kevin M. Picardat
(74) *Attorney, Agent, or Firm*—Myers Bigel Sibley & Sajovec

(57) ABSTRACT

The effective area of a MIM capacitor is increased by forming a lower electrode that includes hemispherical grain lumps. The hemispherical grain lumps are formed by heat-treating a metal layer in an oxygen and/or nitrogen atmosphere, thus oxidizing the surface of the metal layer or growing the crystal grains of the metal layer. The MIM capacitor may be formed of Pt, Ru, Rh, Os, Ir, or Pd, and the hemispherical grain lumps may be formed of Pt, Ru, Rh, Os, Ir, or Pd. Since the metal layer is primarily heat-treated during the formation of the lower electrode, it is possible to reduce the degree to which the surface morphology of the lower electrode is rapidly changed due to a heat treatment subsequent to forming a dielectric layer and an upper electrode.

27 Claims, 12 Drawing Sheets

METHODS FOR MANUFACTURING INTEGRATED CIRCUIT METAL-INSULATOR-METAL CAPACITORS INCLUDING HEMISPHERICAL GRAIN LUMPS

RELATED APPLICATION

This application claims the benefit of Korean Patent Application No. 2001-36584, filed Jun. 26, 2001, the disclosure of which is hereby incorporated herein by reference in its entirety as if set forth fully herein.

FIELD OF THE INVENTION

The present invention relates to integrated circuit capacitors and methods for manufacturing the same, and more particular to Metal-Insulator-Metal (MIM) capacitors and methods for manufacturing the same

BACKGROUND OF THE INVENTION

MIM capacitors are widely used in integrated circuit devices. As is well known to those having skill in the art, a MIM capacitor comprises spaced apart first (lower) and second (upper) metal layers (electrodes) and a dielectric layer therebetween. As the integration density of integrated circuit devices continues to increase, the area occupied by an individual device may continue to decrease. Thus, in MIM capacitors, it may be desirable to increase the capacitance by increasing the effective area of the capacitor, by forming a thin dielectric layer and/or by forming the dielectric layer of a material having high dielectric constant. Unfortunately, a thin film dielectric may produce decreased reliability and high dielectric constant dielectrics may require new manufacturing processes.

In order to increase the effective area of a capacitor, the capacitor may be formed to have a three-dimensional structure, such as a fin structure, a cylinder structure and/or a trench structure. In particular, in the case of a metal-insulator-semiconductor (MIS) capacitor, hemispherical grain (HSG) silicon lumps may be formed of doped polysilicon on the surface of a lower electrode, thereby increasing the effective area of the MIS capacitor. Specifically, polysilicon may be deposited on the surface of an amorphous silicon layer and may be heat-treated in a high vacuum. Silicon atoms around the surface of the amorphous silicon layer may move toward the surface of the polysilicon layer, and thus the HSG lumps may be formed.

The lower electrode of an MIM capacitor may be formed of noble metals, such as Au, Ag, Pd, Pt Ru, Ir, Rh, Hg or Os, and/or their conductive oxides. Since Ru, in particular, can be easily etched by plasma containing oxygen and can form conductive oxides, Ru often may be used in forming the lower electrode of a MIM capacitor. The lower electrode of a MIM capacitor may be formed to have a three-dimensional structure, such as a cylinder structure, a pin structure and/or a trench structure. However, an area increase effect induced by the formation of the HSG lumps in the MIS capacitor may not be obtained in the MIM structure because the lower electrode of the MIM structure is formed of metal rather than silicon.

Moreover, in order to obtain a high dielectric constant from the MIM capacitor, the dielectric layer may be crystallized after forming the dielectric layer and/or the MIM capacitor may be cured by heat-treating the MIM capacitor after forming the upper electrode. However, the dielectric layer may crack due to heat treatment. Thus, there may be limitations in the heat treatment, and the characteristics of a capacitor may be degraded due to the heat treatment.

SUMMARY OF THE INVENTION

Embodiments of the present invention provide integrated circuit MIM capacitors having a lower electrode that includes a metal layer on an integrated circuit substrate and hemispherical grain lumps that protrude from the metal layer. In some embodiments, the metal layer comprises a metal that is capable of inducing growth of crystal grains using a heat treatment. For example, in some embodiments, the metal layer comprises a noble metal. In other embodiments, the metal layer comprises at least one of the noble metals Pt, Ru, Rh, Ir, Os, and Pd. In some embodiments, the metal layer is heat-treated in a nitrogen atmosphere. The metal layer may be heat-treated at between about 500° C. to about 800° C. (for example, about 700° C.). In some embodiments, as a result of the heat treatment in a nitrogen atmosphere, crystal grains are grown on the surface of the metal layer, and the crystal grains form hemispherical grain lumps. Accordingly, in some embodiments, the metal layer and the hemispherical grain lumps both comprise at least one of Pt, Ru, Rh, Os, Ir, and Pd. In other embodiments, the metal layer and the hemispherical grain lumps both comprise the same material.

In other embodiments of the present invention, a metal layer is formed of an oxidizable metal. For example, the metal layer may comprise at least one of Ru, Rh, Os, and Pd. The metal layer is heat-treated in an oxygen atmosphere at about 500° C. As a result of the heat treatment in an oxygen atmosphere, hemispherical grain lumps are formed of a metal oxide on the surface of the metal layer. In some embodiments, before heat-treating the metal layer in an oxygen atmosphere, the metal layer is exposed to plasma containing $O_2$ gas, $N_2O$ gas, a mixed gas of He and $O_2$, NO gas and/or a mixed gas of $O_2$ and $N_2$ so that the hemispherical grain lumps can be uniformly formed of the metal oxide.

According to other embodiments of the present invention, a lower electrode having hemispherical grain lumps includes a metal layer comprised of a first portion and a second portion. In these embodiments, the first and second portions of the metal layer comprise different metals. The hemispherical grain lumps protrude from the second portion of the metal layer. There may be no limitation in the material of the first portion. For example, the first portion may comprise TiN, Ti, or TaN which is used as a barrier layer. The second portion may be formed of a metal, which is capable of inducing growth of crystal grains using a heat treatment. For example, the second portion may comprise at least one of Pt, Ru, Rh, Os, Ir, and Pd. In some embodiments where the first portion is formed of a metal which is not readily oxidized, such as a Pt-based material, the second portion may be formed of an oxidizable metal. For example, the second portion may comprise at least one of Ru, Rh, Os, Ir, and Pd.

According to other embodiments of the present invention, a lower electrode having hemispherical grain lumps includes a metal layer comprised of a first portion and a second portion. In these embodiments, the first and second portions of the metal layer comprise different metals. The hemispherical grain lumps protrude from the second portion of the metal layer. In some embodiments, the surface of the first portion is treated such that the morphology of the surface of the first portion is retained during subsequent heat treatments that are performed after the formation of the first portion. The subsequent heat treatments may include a process for forming the hemispherical grain lumps to protrude from the second portion, a process for crystallizing a dielectric layer, and/or a process for curing a capacitor after forming an upper electrode.

Various embodiments of the present invention can retain the morphology of the first portion. In some embodiments, a metal layer used to form the first portion is formed on an integrated circuit substrate and then is exposed to plasma containing argon (Ar), oxygen ($O_2$) and/or nitrogen ($N_2$). In other embodiments, a metal layer used to form the first portion and a capping layer are sequentially formed on an integrated circuit substrate. Then, the metal layer covered with the capping layer is heat-treated in a nitrogen atmosphere at about 500° C. to about 800° C. (for example, about 700° C.), and the capping layer is removed. Next, the metal layer is exposed to plasma containing argon (Ar), oxygen ($O_2$) and/or nitrogen ($N_2$).

According to other embodiments of the present invention, a lower electrode having hemispherical grain lumps is formed by sequentially forming a metal layer and a metal oxide layer on an integrated circuit substrate and heat-treating the metal oxide layer in a nitrogen atmosphere. As a result of the heat treatment in a nitrogen atmosphere, the hemispherical grain lumps are formed to protrude from the metal oxide layer. In some embodiments, the metal layer can be prevented from being thermally deformed by the metal oxide layer.

According to other embodiments of the present invention, a lower electrode having hemispherical grain lumps includes a metal layer on an integrated circuit substrate. The hemispherical grain lumps are formed between the metal layer and the substrate. The metal layer is thin and conformal, to maintain the profile of the hemispherical grain lumps protruding above the substrate.

In these embodiments, the hemispherical grain lumps may comprise metal or metal oxide. In some embodiments, Pt, Ru, Rh, Os and/or Pd is deposited on the substrate and then is heat-treated in a nitrogen atmosphere at about 500° to about 800° C. (for example, about 700° C.). The crystal grains of the metal grow on the substrate to form hemispherical grain lumps. Alternatively, an oxidizable metal, for example Ru, Rh, Os, Ir and/or Pd is deposited on the substrate and then is heat-treated in an oxygen atmosphere at about 500° C. to about 800° C. (for example, about 500° C.). Then, the surface of the metal layer is oxidized, thus forming hemispherical grain lumps of a metal oxide.

Before the heat treatment in a nitrogen or oxygen atmosphere, a capping layer (such as an oxide layer) is formed on the metal layer. Next, the metal layer covered with the capping layer is heat-treated in a nitrogen atmosphere at about 700° C. and then the capping layer is removed. Hemispherical grain lumps can be formed to protrude from a dielectric layer on the substrate according to these embodiments.

In some embodiments of the present invention, predetermined portions of the surface of the substrate may be exposed between the hemispherical grain lumps. In other embodiments, a thin metal layer may cover the predetermined portions of the surface of the substrate that are exposed between the hemispherical grain lumps as well as the hemispherical grain lumps. Accordingly, dielectric layers to be formed on the lower electrode can be prevented from being connected to the semiconductor substrate and/or a contact plug on the substrate. The thin metal layer may comprise a metal which has good interfacial characteristics with a dielectric layer. The material of the thin metal layer is not restricted to noble metals. The size of the hemispherical grain lumps may vary depending on the thickness of the metal layer and the time duration and/or temperature of the heat treatment.

As described above, since a lower electrode of a MIM capacitor includes hemispherical grain lumps protruding toward a dielectric layer, the effective area of the MIM capacitor may increase, and thus it is possible to increase the capacitance of the MIM capacitor, according to embodiments of the present invention. Moreover, in some embodiments of the present invention, a metal layer used to form a lower electrode is deposited on a substrate and then is heat-treated in a nitrogen and/or oxygen atmosphere to form hemispherical grain lumps before forming a dielectric layer. In other words, in these embodiments, the surface of the metal layer is deformed before the formation of the dielectric layer. Accordingly, the deformation of the lower electrode caused by heat treatments subsequent to the formation of the lower electrode and the dielectric layer can be reduced or prevented, and thus cracks in the dielectric layer can be reduced or eliminated.

DETAILED DESCRIPTION OF THE PREFERRED EMBODIMENT

Figure 1A:
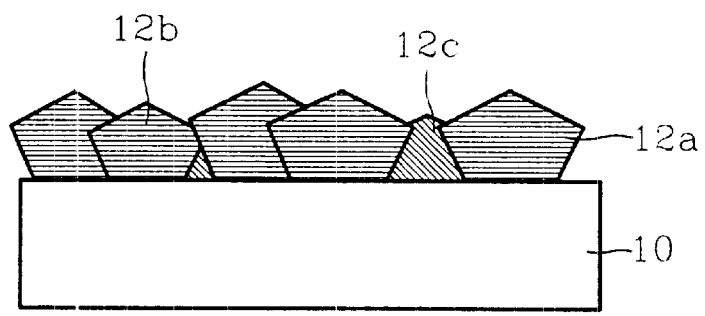
FIGS. 1A and 1B are cross-sectional views illustrating hemispherical grain lumps formed on a ruthenium layer by a heat treatment under a nitrogen atmosphere according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well.

Lower and/or upper electrodes of an MIM capacitor may be formed of noble metals including Au, Ag, Hg, Ru, Rh, Os, Pt, Ir and/or Pd, and/or their oxides. In some embodiments, the lower and/or upper electrodes may be formed of Ru, Rh, Os, Pt, Ir and/or Pd, and/or their oxides.

Hereinafter, increasing the surface area of a lower electrode by forming hemispherical grain lumps of noble metal or noble metal oxide, according to embodiments of the invention, will be described. Although all the above noble meals may have similar characteristics in that if heat is applied, crystal grains grow or the noble metals form oxides, only ruthenium will be described here for the sake of brevity.

Figure 1B:
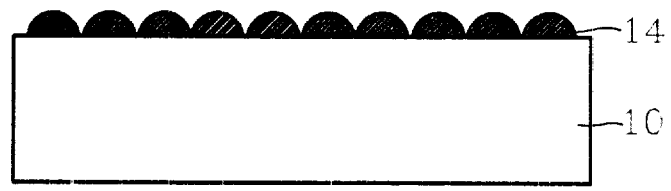

Referring to FIGS. 1A and 1B, if a noble metal layer, for example, a ruthenium layer 10 is heat-treated in a nitrogen atmosphere, ruthenium atoms move so as to reduce the surface energy or crystal grain boundary energy of the ruthenium layer 10. As a result, the crystal grains of the ruthenium layer 10 grow or ruthenium atoms at the surface of the ruthenium layer 10 agglomerate. In other words, crystal grains 12a, 12b, and 12c growing on the surface of the ruthenium layer 10 or agglomerate grains 14 are formed.

Figure 2A:
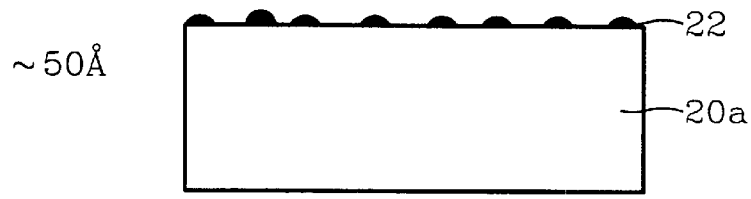
FIGS. 2A through 2D are cross-sectional views illustrating growth of ruthenium crystal grains undergoing the heat treatment according to the thickness of an electrode according to embodiments of the present invention.
Figure 2B:
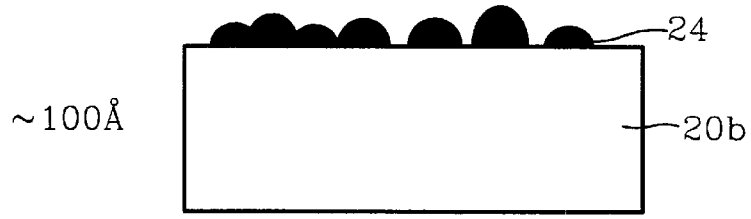
Figure 2C:
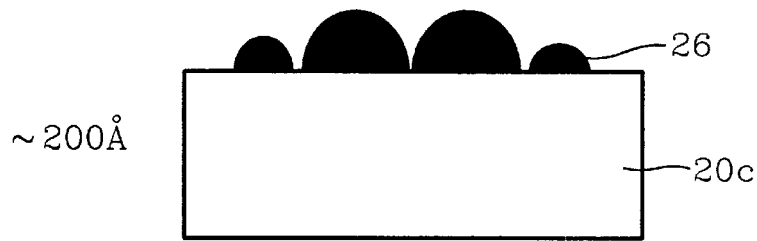
Figure 2D:

The size of such crystal grains or agglomerate grains may be varied depending on the thickness of a metal layer when heat-treating the metal layer in a nitrogen atmosphere, as will be described with reference to FIGS. 2A through 2D. Ruthenium layers are each deposited to thicknesses of 50 Å, 100 Å, 150 Å, and 200 Å on an integrated substrate, such as a semiconductor substrate or a dielectric layer 20a, 20b, 20c, and 20d, respectively, and are heat-treated in a nitrogen atmosphere for about thirty minutes. As the thickness of a ruthenium layer deposited on each of the dielectric layers 20a, 20b, 20c, and 20d increases, the size and/or height of hemispherical grain lumps 22, 24, 26, and 28 increase. As shown in FIGS. 2A and 2B, the hemispherical grain lumps 22 and 24 formed on ruthenium layers having a thickness no greater than 200 Å are discontinuous and expose predetermined portions of the semiconductor substrate or the dielectric layers 20a and 20b.

The size and/or height of hemispherical grain lumps may be increased or decreased by heat treatment conditions, such as heat treatment temperature and/or heat treatment time, as well as the thickness of the ruthenium layer. For example, if the heat treatment of a ruthenium layer is performed for a longer time or at a higher temperature, the growth of crystal grains can be accelerated.

Figure 3:
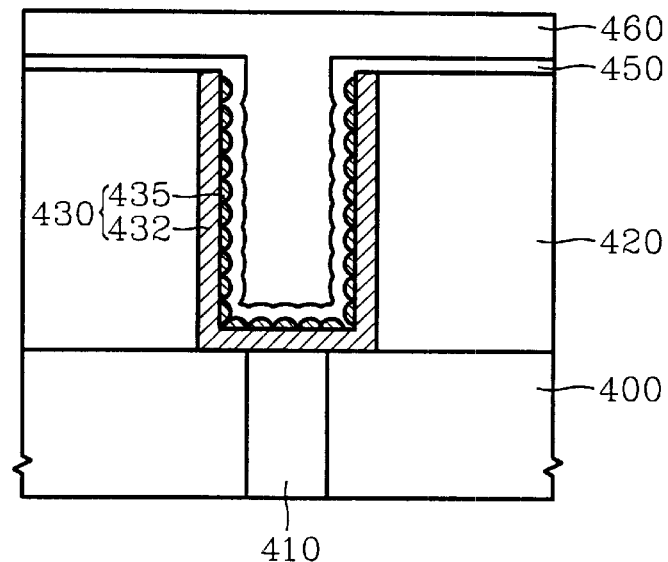
FIG. 3 is a cross-sectional view illustrating a capacitor using a ruthenium layer, on which hemispherical grain lumps shown in FIGS. 1A and 1B are formed as a lower electrode according to embodiments of the present invention.
Figure 4:
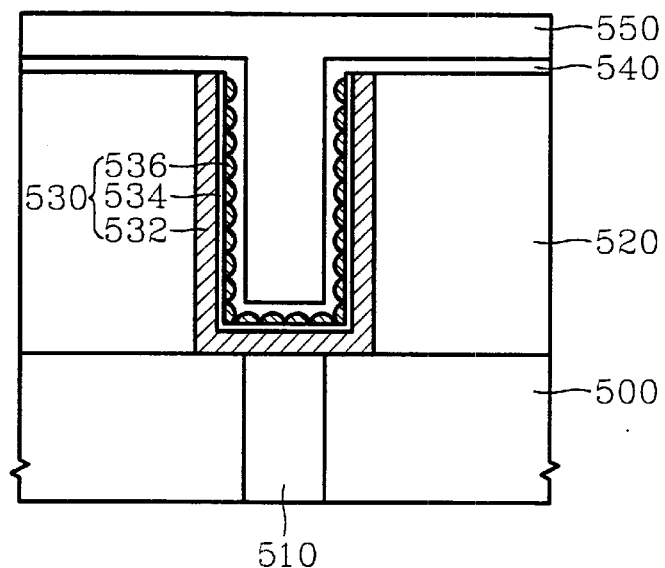
FIG. 4 is a cross-sectional view illustrating another capacitor using a ruthenium layer as a lower electrode according to embodiments of the present invention.
Figure 5:
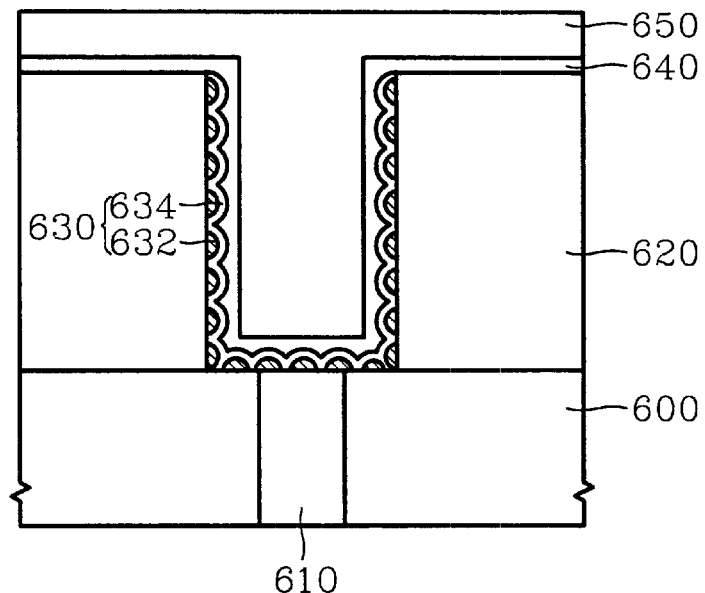
FIG. 5 is a cross-sectional view illustrating another capacitor using a ruthenium layer as a lower electrode according to embodiments of the present invention.

MIM capacitors including lower electrodes, each of which has hemispherical grain lumps formed through heat treatment of a metal layer in a nitrogen atmosphere according to embodiments of the invention, are illustrated in FIGS. 3 through 5. Various embodiments for manufacturing such capacitors are illustrated in FIGS. 6A and 6B, 7A and 7B, 8A and 8B, 9A through 9C, 10A and 10B, and 11A through 11C.

As shown in FIGS. 2A through 2D, in some embodiments, if the thickness of a metal layer exceeds a predetermined level, hemispherical grain lumps are formed such that the surface of an underlying layer is not exposed. Thus, it is possible to form a lower electrode having an increased effective area. A capacitor including such a lower electrode is illustrated in FIG. 3.

Referring to FIG. 3, a first interlayer dielectric layer 400 includes a contact plug 410 on an integrated circuit substrate (not shown). A second interlayer dielectric layer 420 includes an opening on the first interlayer dielectric layer 400 such that the contact plug 410 is exposed through the opening. A first metal layer 432 is provided on the sidewalls and floor of the opening of the second interlayer dielectric layer 420. Hemispherical grain lumps 435 protrude from the first metal layer 432. In these embodiments, the hemispherical grain lumps 435 are formed of the same metal as the first metal layer 432. The first metal layer 432 and the hemispherical grain lumps 435 form a lower electrode 430. A dielectric layer 450 is provided on the hemispherical grain lumps 435 and the second interlayer dielectric layer 420. The dielectric layer 450 may comprise $Ta_2O_5$, $SrTiO_3$(STO), $(Ba, Sr)TiO_3$(BST), $PbTiO_3$, $Pb(Zr, Ti)O_3$(PZT), $SrBi_2Ta_2O_5$(SBT), $(Pb, La)(Zr, Ti)O_3$, $Bi_4Ti_3O_{12}$, and/or $BaTiO_3$(BTO). A second metal layer 460, which corresponds to an upper electrode of a capacitor, is provided on the dielectric layer 450.

In some embodiments, the first metal layer 432 of the lower electrode 430, the hemispherical grain lumps 435, and the upper electrode 460 comprise Ru, Rh, Pt, Os and/or Pd.

As shown in FIGS. 2A through 2D, if the thickness of a metal layer on which hemispherical grain lumps will be formed, is no greater than a predetermined level, the hemispherical grain lumps may be nonuniformly formed on the metal layer, and thus the surface of an underlying layer, that is, the surface of the dielectric layer 20a or 20b, may be exposed. In this case, as shown in FIGS. 4 and 5, a metal layer may be provided as a double layer such that a dielectric layer formed on the metal layer can be prevented from contacting layers under the metal layer.

In order to form the metal layer into a double layer, it is possible to make hemispherical grain lumps directly on a dielectric layer or to form a thin metal layer between an underlying layer including hemispherical grain lumps and a dielectric layer while forming the hemispherical grain lumps directly on the underlying layer.

When forming a metal layer into a double layer by making hemispherical grain lumps directly on a dielectric layer, the metal layer is not restricted to a double layer but may be three- or more-layered. In this case, the uppermost metal layer constituting the multilayered metal layer should have characteristics that if the uppermost metal layer is heat-treated, crystal grains grow from the uppermost metal layer of the metal layer. A capacitor formed through this method is illustrated in FIG. 4.

In FIG. 4, a lower electrode 530 includes a first metal layer 532, a second metal layer 534, and hemispherical grain lumps 536 protruding from the second metal layer 534. As shown in FIG. 4, the hemispherical grain lumps 536 may be formed of the same metal-as the second metal layer 534 or its metal oxides. The first and second metal layers 532 and 534 may be formed of the same material or different materials.

The second metal layer 534 may not appear in a finished lower electrode depending on processing conditions. For example, if the second metal layer 534 is very thin and is heat-treated at a high temperature and/or for a long time, the entire second metal layer 534 may be transformed into hemispherical grain lumps 536, thereby forming a lower electrode consisting of the first metal layer 532 and the hemispherical grain lumps 536.

In other embodiments, the first and second metal layers 532 and 534 are formed of the same material and the hemispherical grain lumps 536 are formed of metal, the first and second metal layers 532 and 534 may be formed of a metal that is capable of inducing growth of crystal grains, for example, Pt, Ru, Rh, Ir, Os, or Pd.

In still other embodiments, it is possible to form a lower electrode by replacing the second metal layer 534 with a conductive layer formed of an oxide of a metal forming the first metal layer 532, such as an oxide of Ru, Rh, Os, Ir, or Pd. In these embodiments, however, hemispherical grain lumps 536 may be formed of a metal oxide through growth of crystal grains caused by a heat treatment in a nitrogen atmosphere.

In yet other embodiments, if the first and second metal layers 532 and 534 comprise different materials and the hemispherical grain lumps 536 comprise metal, the first metal layer 532 may comprise any metal. For example, TiN, Ti, or TaN, which generally acts as a barrier layer, may be used to form the first metal layer 532, which can improve the characteristics of an interface between an oxide dielectric layer and the first metal layer. The second metal layer 534 may be formed of a metal that is capable of inducing growth of crystal grains during a subsequent heat treatment, such as Pt, Ru, Rh, Os, Ir, or Pd. On the other hand, in still other embodiments, if the first and second metal layers 532 and 534 comprise different materials and the hemispherical grain lumps 536 comprise a metal oxide, the first metal layer 532 is may comprise metal which is resistant to oxidation, such as Pt. The second metal layer 534 may comprise Ru, Rh, Os, Ir and/or Pd.

Reference numerals 500, 510, 540, and 550, which have not been mentioned yet, refer to a first interlayer dielectric layer formed on a substrate (not shown), a contact plug, a dielectric layer, and an upper electrode, respectively.

Embodiments of capacitors formed by forming a thin metal layer between an underlying layer including hemispherical gain lumps and a dielectric layer while the hemispherical grain lumps are directly on the underlying layer are illustrated in FIG. 5.

In FIG. 5, a lower electrode 630 includes hemispherical grain lumps 632 directly on a first interlayer dielectric layer 620, a dielectric layer 600, and a contact plug 610, and a first metal layer 634 covering the underlying layers including the hemispherical grain lumps 632. Here, the hemispherical grain lumps 632 may be formed of a metal or a metal oxide. In embodiments where the hemispherical grain lumps 632 comprise metal, Pt, Ru, Rh, Os, Ir and/or Pd may be used. In embodiments wherein the hemispherical grain lumps 632 comprise metal oxide, a metal which can form an oxide when heat-treated, such as Ru, Rh, Os, Ir, or Pd may be used.

Reference numerals 600, 640, and 650, which have not been mentioned yet, refer to a first interlayer dielectric layer, a dielectric layer, and an upper electrode, respectively.

Hereinafter, methods for forming the capacitors shown in FIGS. 3 through 5 will be described.

Figure 6A:
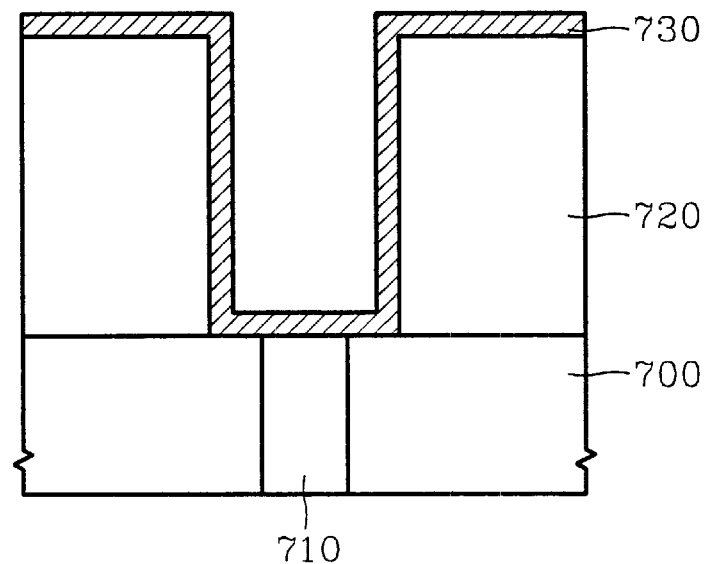
FIGS. 6A through 6C are cross-sectional views illustrating methods for forming the capacitor of FIG. 3 according to embodiments of the present invention.
Figure 6B:
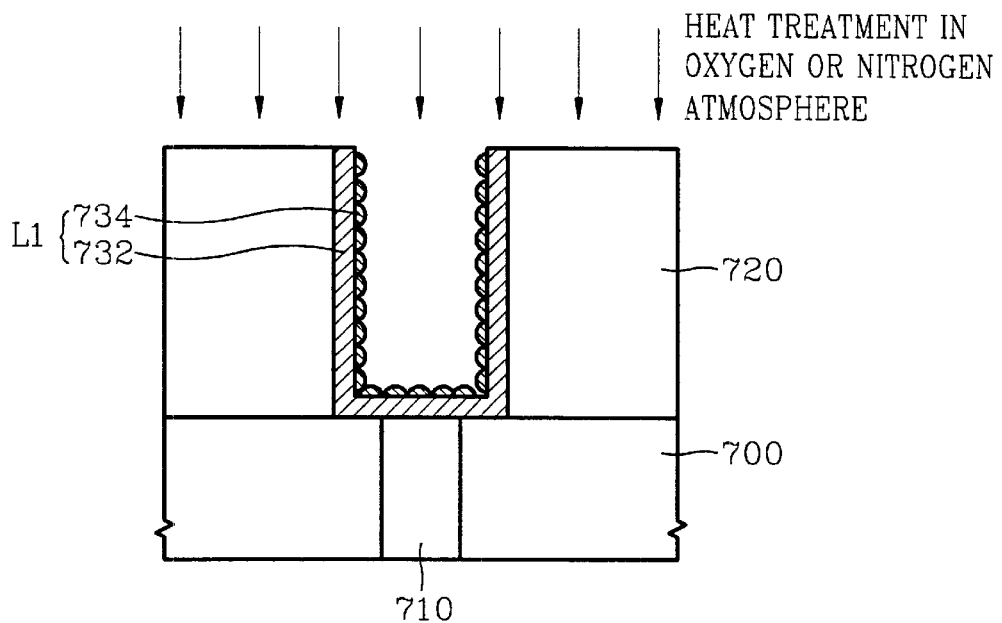
Figure 6C:
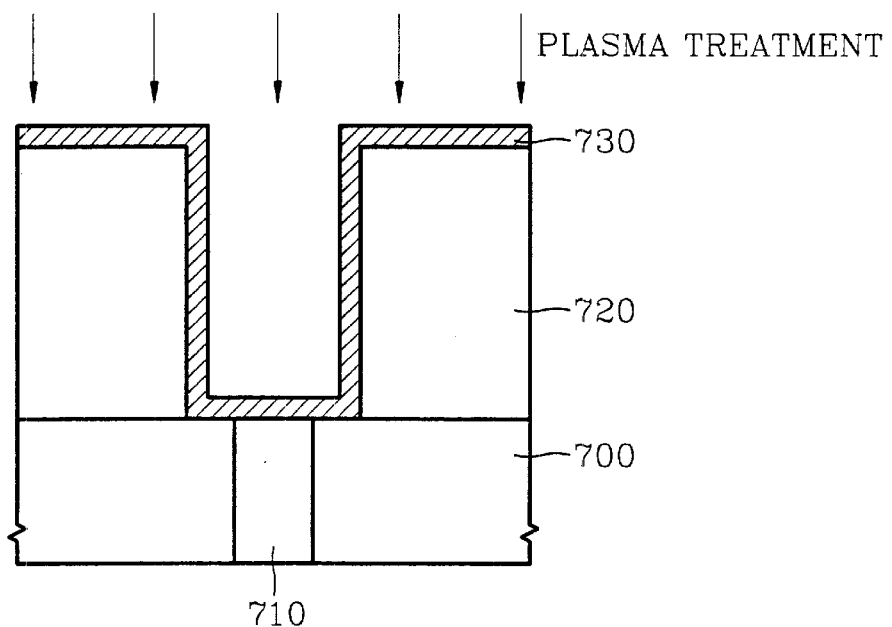

FIGS. 6A through 6C are cross-sectional views illustrating methods for manufacturing capacitors shown in FIG. 3. The conventional steps of forming a dielectric layer and an upper electrode after a step of forming a lower electrode are not illustrated in FIGS. 6A through 6C. Referring to FIG. 6A, a contact plug 710 is formed in a first interlayer dielectric layer 700. A second interlayer dielectric layer 720 is formed to have an opening on the first interlayer dielectric layer 700 including the contact plug 710 formed therein such that the contact plug 710 is exposed through the opening of the second interlayer dielectric layer 720. A metal layer 730 is formed at the sides and floor of the opening and on the second interlayer dielectric layer 720. Next, if the metal layer 730 is heat-treated in a nitrogen atmosphere, as shown in FIG. 56B, hemispherical grain lumps are formed. Next, the metal layer 730 and the hemispherical grain lumps are polished until the top surface of the second interlayer dielectric layer 720 is exposed, thereby forming a lower electrode L1 including a metal layer 732 and hemispherical grain lumps 734. The metal layer 732 shown in FIG. 6B is formed by heat-treating and polishing the metal layer 730.

If the metal layer 730 is heat-treated in a nitrogen atmosphere at a temperature higher than the crystallization temperature of a dielectric layer or the temperature of curing a capacitor, i.e., about 500° to about 800° C. for about ten minutes to about three hours, for-example, at about 700° C. for about thirty minutes, crystal grains grow from the surface of the metal layer 730 such that the hemispherical grain lumps 734 formed of the same metal as the metal layer 730 are formed. In order to obtain the hemispherical grain lumps 734 from the growth of crystal grains, Pt, Ru, Rh, Os, Ir and/or Pd may be used.

Referring to FIG. 6C, in other embodiments, the hemispherical grain lumps 734 may be formed by heat-treating the metal layer 730 in an oxygen atmosphere. In this case, the metal layer 730 is exposed to plasma containing oxygen, for example, $O_2$ gas, $N_2O$ gas, a mixed gas of He and $O_2$, NO gas and/or a mixed gas of $O_2$ and $N_2$, during the heat-treatment, thereby uniformly forming metal oxide, i.e., the hemispherical grain lumps 734 at the surface of the metal layer 730. Here, the metal layer may be formed of Ru, Rh, Os, Ir, or Pd.

FIGS. 7A and 7B, 8A and 8B, 9A through 9C, and 10A and 10B are cross-sectional views illustrating methods for manufacturing the capacitor shown in FIG. 4 according to embodiments of the invention. For the sake of brevity, manufacturing steps after forming a lower electrode are not illustrated in these figures.

Figure 7A:
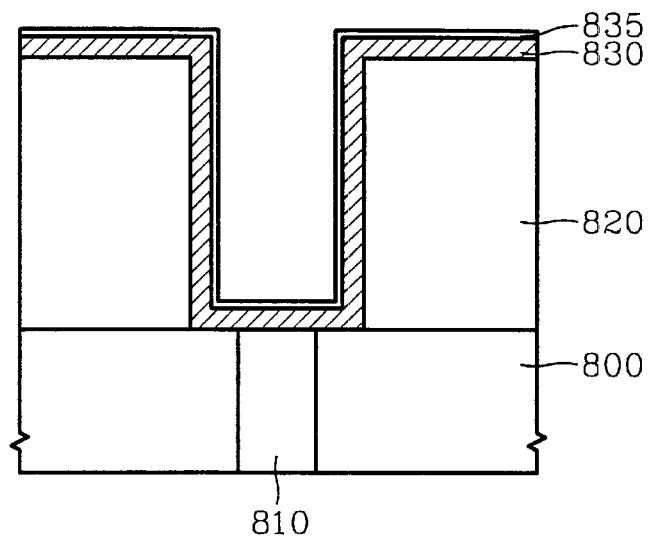
FIGS. 7A and 7B, 8A and 8B, 9A through 9C, and 10A and 10B are cross-sectional views illustrating methods for forming capacitors of FIG. 4 according to the present invention.

Referring to FIG. 7A, steps of preparing a first interlayer dielectric layer 800 including a contact plug 810 and forming a second interlayer dielectric layer 820 having an opening through which the contact plug 810 is exposed can be the same as described above with reference to FIG. 6A. A first metal layer 830 and a second metal layer 835 are sequentially formed of different metals at the sides and floor of the opening and on the second interlayer dielectric layer 820. The first metal layer 830 may be formed of any kind of metal, such as TiN, Ti, or TaN, which is used as a barrier layer.

Figure 7B:
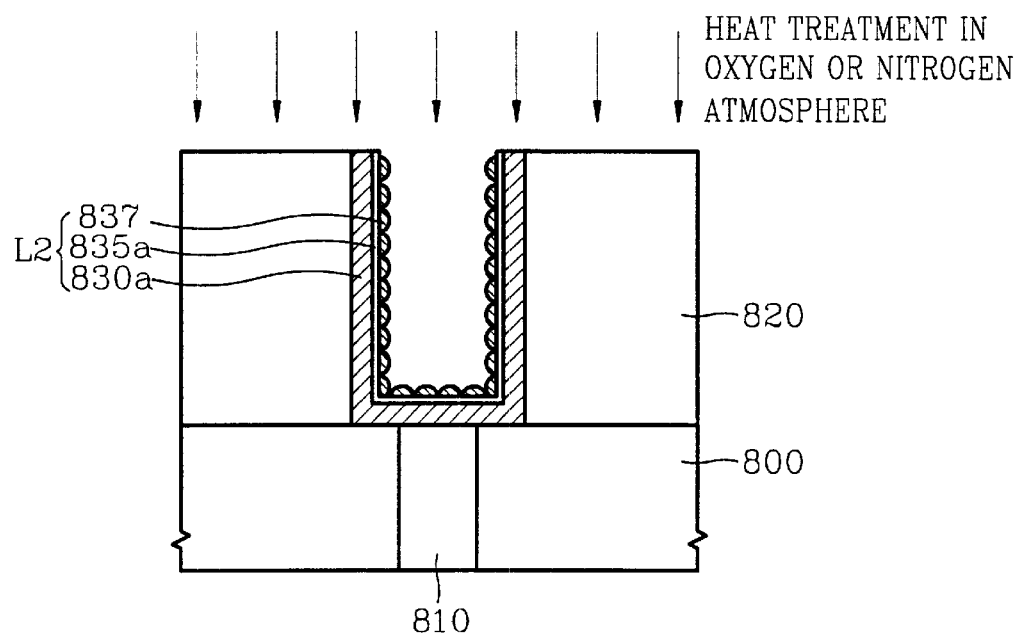

Referring to FIG. 7B, the first metal layer 830 and second metal layer 835 are polished until the surface of the second interlayer dielectric layer 820 is exposed. The second metal layer 835a that is polished is heat-treated in an oxygen atmosphere and/or a nitrogen atmosphere, thereby forming hemispherical grain lumps 837 to protrude from the surface of the second metal layer 835a. Predetermined portions or all of the second metal layer 835a may be transformed into the hemispherical grain lumps 837 depending on heat treatment conditions. In some embodiments, the second metal layer 835a is only partially transformed into the hemispherical grain lumps 837. Accordingly, in these embodiments, a lower electrode L2 includes a first metal layer 830a, portions of the second metal layer 835a not transformed into the hemispherical grain lumps 837, and the hemispherical grain lumps 837. The effective area of the lower electrode L2 is increased due to the hemispherical grain lumps 837.

The hemispherical grain lumps 837 formed by heat-treating the second metal layer 835 in a nitrogen atmosphere at about 500° C. to about 800° C. may be formed of the same metal as the second metal layer 835, such as Pt, Ru, Rh, Os, Ir, or Pd.

Figure 8A:
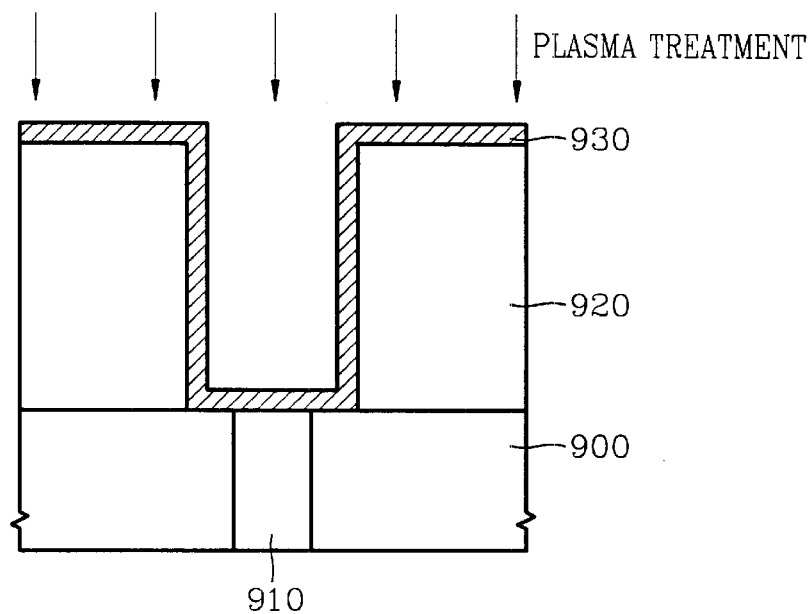

Referring to FIG. 8A, a first metal layer 930 is formed at the sides and bottom of an opening, through which a contact plug 910 is exposed, on a second interlayer dielectric layer 920 and then is exposed to plasma containing $N_2$, $O_2$ and/or argon (Ar). The plasma treatment can be replaced by any treatment that is capable of accelerating charged particles and then inducing a collision between the charged particles and the first metal layer 930.

Figure 8B:
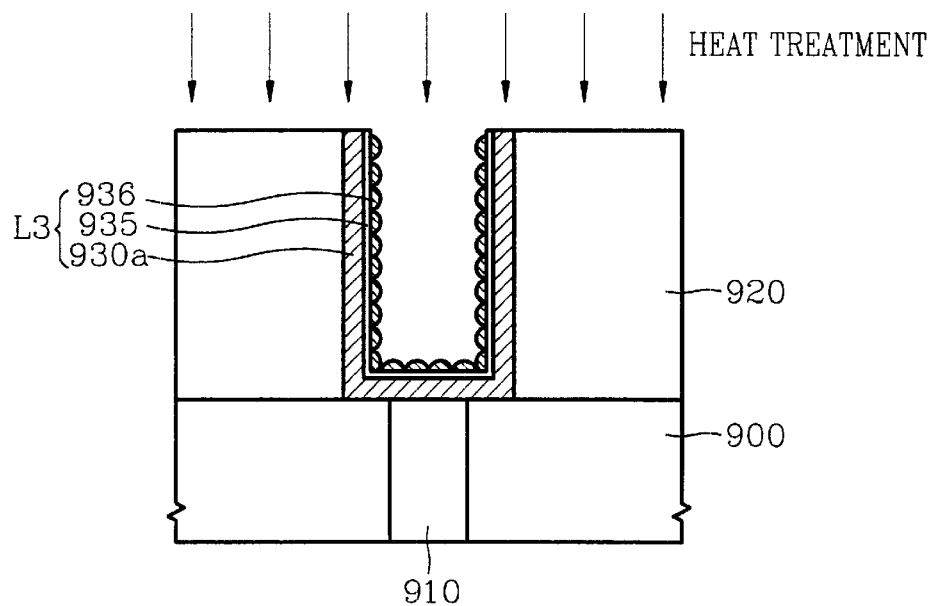

A second metal layer 935 is formed of the same material as the first metal layer 930 on the plasma-treated first metal layer 930. Next, the first and second metal layers 930 and 935 are polished until the top surface of the second interlayer dielectric layer 920 is exposed. Next, the second metal layer 935 is heat-treated in a nitrogen atmosphere. As a result, hemispherical grain lumps 936 are formed on the second metal layer 935. As shown in FIG. 8B, predetermined portions or all of the second metal layer 935 may be transformed into the hemispherical grain lumps 936. In the present embodiments, the second metal layer 935 is only partially transformed into the hemispherical grain lumps 936. Accordingly, a lower electrode L3 includes a first metal layer 930a, the second metal layer 935, and the hemispherical grain lumps 936.

As described above, if an activation energy for growing the crystal grains of the first metal layer is increased by damaging the surface of the first metal layer 930 through the plasma treatment, the first metal layer 930 may be prevented from being rapidly deformed by a subsequent heat treatment, i.e., the heat treatment of the second metal layer 935. In addition, if the second metal layer 935 is heat-treated, hemispherical grain lumps 936 may be formed at the surface of the second metal layer 935 such that a contact area between the hemispherical grain lumps and a dielectric layer to be formed on the hemispherical grain lumps increases.

The materials of the hemispherical grain lumps 936 formed in an oxygen or nitrogen atmosphere and the second metal layer 935 can be the same as those described with reference to FIGS. 6A and 6B, and 7A and 7B, and thus their descriptions will not be repeated. Reference numeral 900, which has not been mentioned yet, refers to a first dielectric layer formed on a substrate (not shown).

Figure 9A:
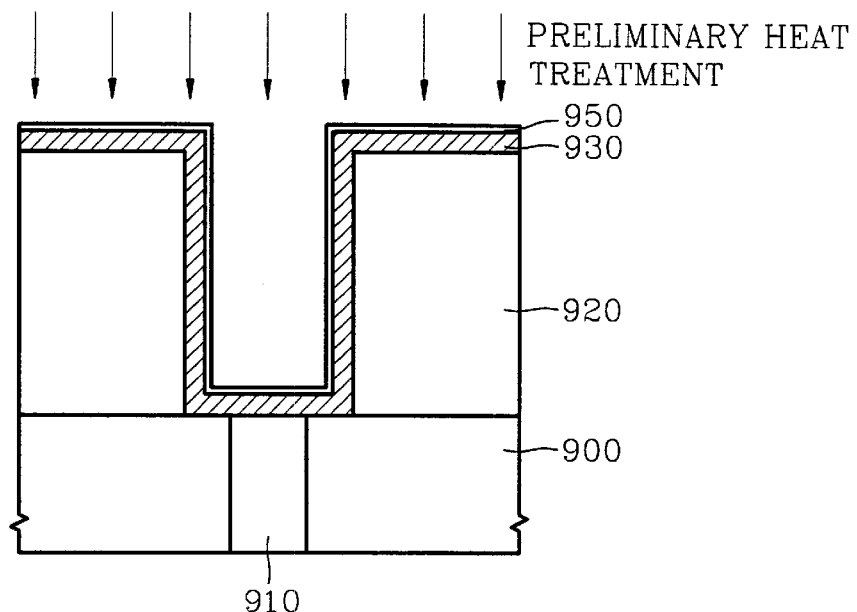

Referring to FIG. 9A, the first metal layer 930 is formed at the sides and bottom of the opening, through which the contact plug 910 is exposed, and on the second interlayer dielectric layer 920. Next, a capping layer 950 is formed of a material that does not react significantly with the first metal layer 930, such as an oxide layer. The first metal layer 930 and the capping layer 950 are preheat-treated in a nitrogen atmosphere at about 500° C. to about 800° C., thereby growing the crystal grains of the first metal layer 930.

Figure 9B:
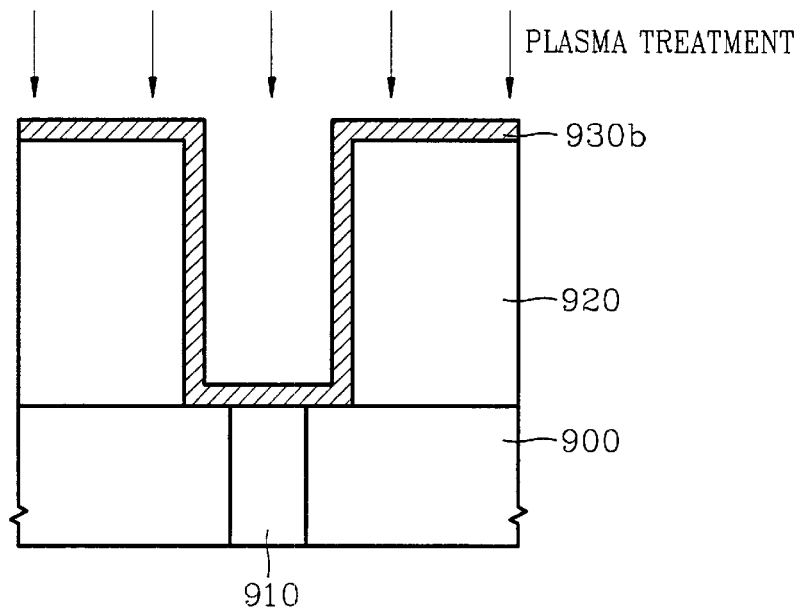

Referring to FIG. 9B, the first metal layer 930 is exposed by removing the capping layer 950. The exposed first metal layer 930 is plasma-treated. The plasma treatment of the first metal layer 930 can be the same as that of the first metal layer 930 described above with reference to FIG. 8A.

Figure 9C:
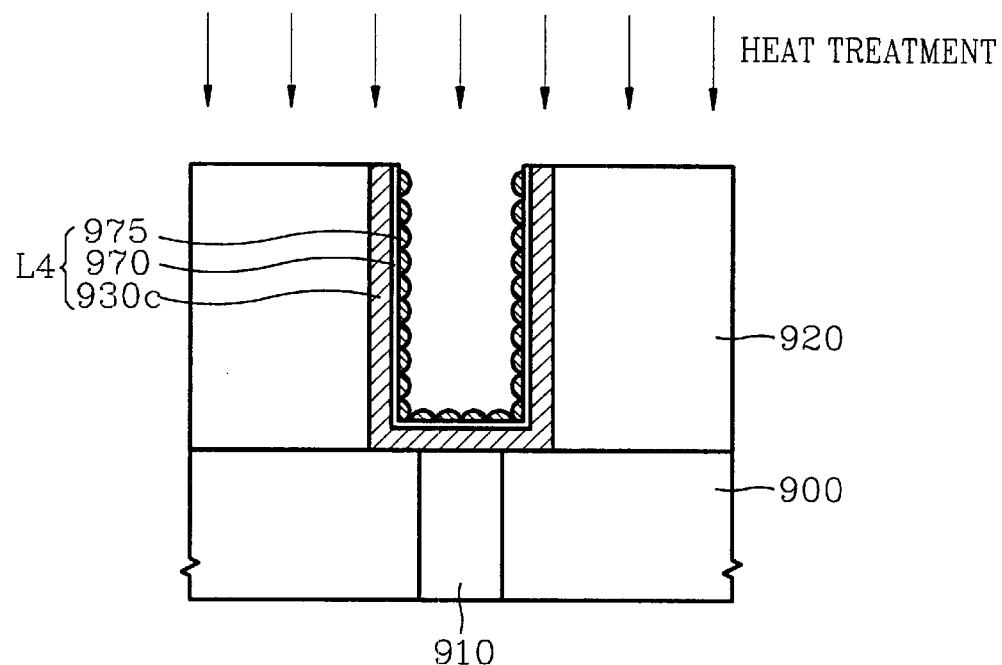

Referring to FIG. 9C, a second metal layer 970 is formed on a first metal layer 930b, which has been plasma-treated, and then the first and second metal layers 930 and 970 are polished until the top surface of the second interlayer dielectric layer 920 is exposed. Next, the second metal layer 970 is heat-treated in a nitrogen atmosphere so as to form hemispherical grain lumps 975 protruding from the second metal layer 970. As shown in FIGS. 7B and 8B, predetermined portions or all of the second metal layer 970 may be transformed into the hemispherical grain lumps 975. However, in some embodiments, the second metal layer 970 is partially transformed into the hemispherical grain lumps 975. In other words, as shown in FIG. 9C, a lower electrode L4 including the first metal layer 930c, which has been plasma-treated, portions of the second metal layer 970 not transformed into the hemispherical grain lumps 975, and the hemispherical grain lumps 975 protruding from the top surface of the second metal layer 970 is provided.

After preliminarily heat-treating and plasma-treating the first metal layer 930, the surface of the first metal layer 930 can be prevented from being deformed by a subsequent heat treatment, i.e., the heat-treatment of the second metal layer 970. On the other hand, since the second metal layer 970 has never been subject to a preliminary heat treatment, crystal grains grow or oxides are formed at the surface of the second metal layer 970 due to a heat treatment subsequent to the formation of the second metal layer, and thus the hemispherical grain lumps 975 are formed.

The materials of the hemispherical grain lumps 936 formed in an oxygen or nitrogen atmosphere and the second metal layer 935 can be the same as described above with reference to FIGS. 6A and 6B, and 7A and 7B, and thus their description will not be repeated.

Figure 10A:
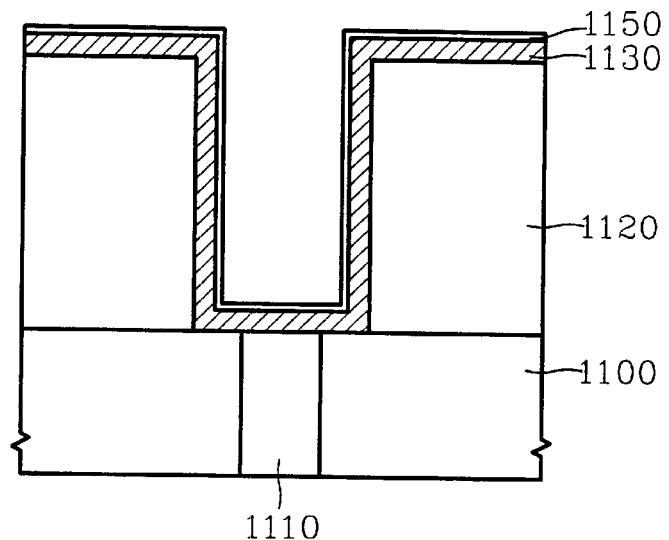

Referring to FIG. 10A, a first metal layer 1130 and a metal oxide layer 1150 are sequentially formed at the sides and floor of an opening, through which a contact plug 1110 is exposed, and on the top surface of a second interlayer dielectric layer 1120. Next, the first metal layer 1130 and the metal oxide layer 1150 are polished until the top surface of the second interlayer dielectric layer 1120 is exposed.

Figure 10B:
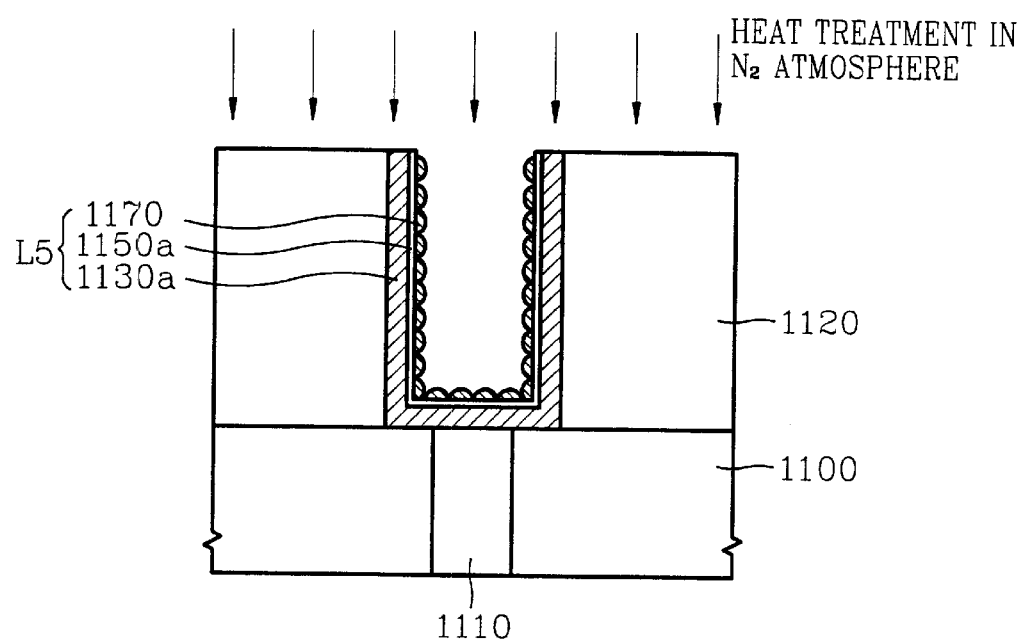

Next, as shown in FIG. 10B, a substrate including the metal oxide layer 1150 is heat-treated in a nitrogen atmosphere. In some embodiments, the temperature of the heat treatment is higher than the crystallization temperature of a dielectric layer or the temperature of curing a capacitor, for example, between about 500° C. and about 800° C. In some embodiments, the heat treatment is performed at about 700° C. for about thirty minutes. As a result of the heat treatment, metal oxide crystal grains grow on the surface of the metal oxide layer 1150, and thus hemispherical grain lumps 1170 are formed. Accordingly, as shown in FIG. 10B, a lower electrode L5 includes a first metal layer 1130a, a metal oxide layer 1150, and the hemispherical grain lumps 1170 formed of a metal oxide.

Figure 11A:
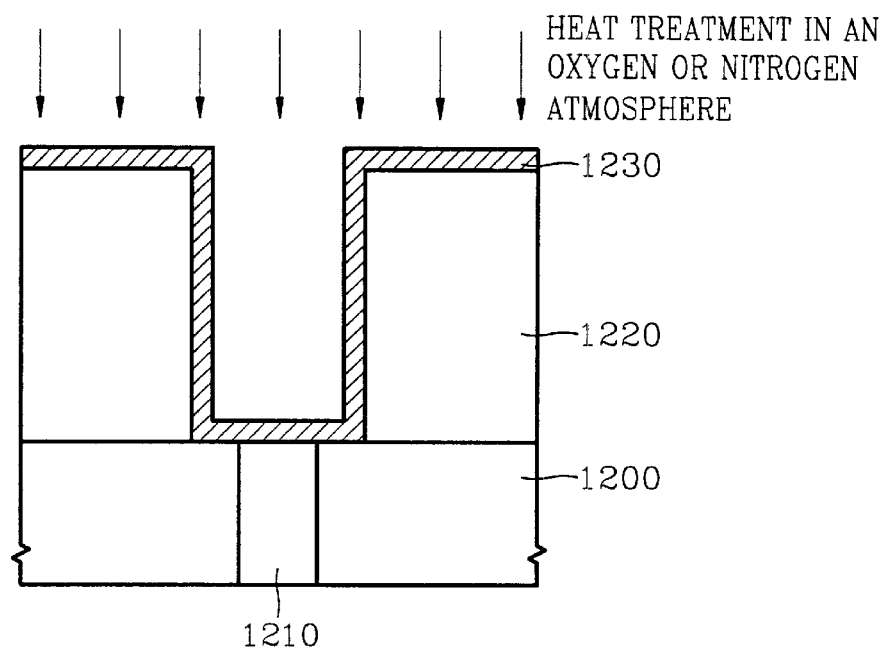
FIGS. 11A through 11C are cross-sectional views illustrating methods for forming capacitors of FIG. 5 according to the present invention.
Figure 11B:
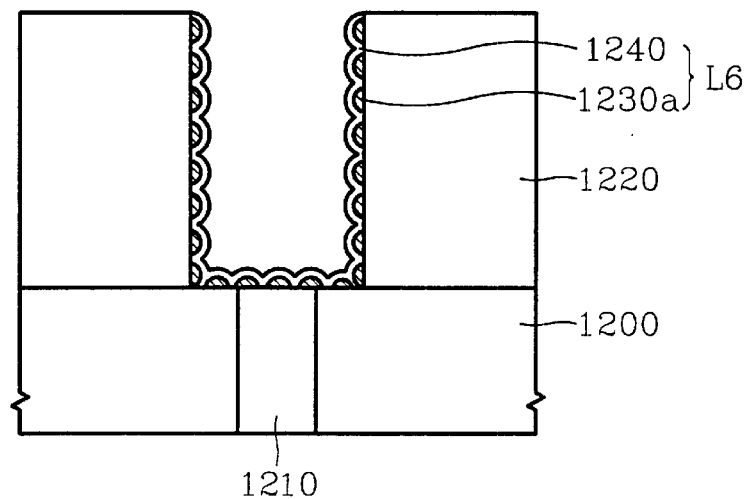
Figure 11C:
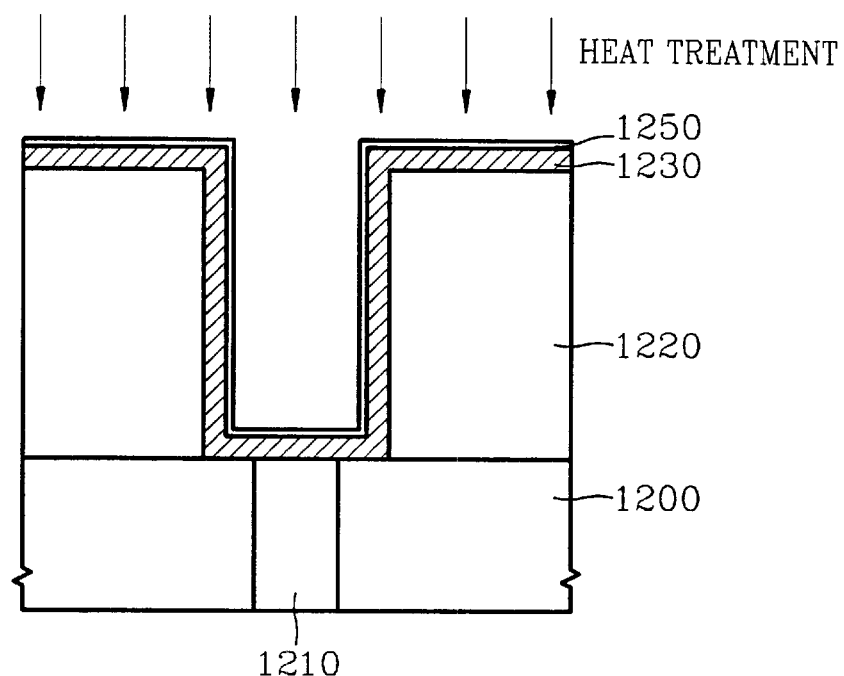

FIGS. 11A through 11C are cross-sectional views illustrating methods for manufacturing capacitors shown in FIG. 5. Only the manufacturing steps performed until a lower electrode is formed are illustrated in these figures. Referring to FIG. 11A, a first metal layer 1230 is formed at the sides and floor of an opening, through which a contact plug 1210 is exposed, and on the top surface of a second interlayer dielectric layer 1220. Referring to FIG. 11B, the first metal layer 1230 is heat-treated in an oxygen and/or nitrogen atmosphere, thereby forming hemispherical grain lumps 1230a. Since the first metal layer 1230 is very thin, as described above with reference to FIGS. 2A through 2D (particularly, FIGS. 2A and 2B), a substrate (not shown), or a first interlayer dielectric layer 1200, the second interlayer dielectric layer 1220, and the contact plug 1210 are partially exposed between the hemispherical grain lumps 1230a that are nonuniformly formed.

As shown in FIG. 11C, a capping layer 1250 is formed of a material that does not react significantly with the first metal layer 1230, such as an oxide layer, between the step of depositing the first metal layer 1230 on the substrate including the second interlayer dielectric layer 1220 and the step of heat-treating the first metal layer 1230. Next, the first metal layer 1230 is heat-treated to grow crystal grains, thus forming hemispherical grain lumps. Next, the capping layer 1250 is removed.

Referring again to FIG. 11B, a second metal layer 1240 is conformally deposited along the shape of the hemispherical grain lumps formed through one of the embodiments described above so as to cover the underlying layers including the hemispherical grain lumps 1230a. Next, the hemispherical grain lumps and the second metal layer are polished until the top surface of the second interlayer dielectric layer 1220 is exposed, thereby forming a lower electrode including hemispherical grain lumps 1230a and a second metal layer 1240. The second metal layer 1240 may be formed of a metal that is stable in processes subsequent to the formation of the lower electrode L6 and has superior interfacial characteristics with respect to a dielectric layer. For example, the second metal layer 1240 may be formed of noble metals including Pt, Rh, Os, Ir, and Pd.

The materials of the hemispherical grain lumps 1230a and the second metal layer 1240 can be the same as described above with reference to FIGS. 6A and 6B, and 7A and 7B, and thus their description will not be repeated.

According to embodiments of the present invention, it is possible to form a lower electrode having hemispherical grain lumps without exposing a dielectric layer or a contact plug, and thus it is possible to increase the capacitance of a capacitor without appreciably deteriorating the characteristics of a device.

In addition, in a conventional MIM structure, a dielectric layer is crystallized after a lower electrode and a dielectric layer are formed, and a capacitor is cured through heat treatment after an upper electrode is formed. However, since the dielectric layer may slightly crack due to the heat treatment, there may be a limit in performing the heat-treatment after the formation of the lower electrode and the dielectric layer. In embodiments of the present invention, the metal layer used for a lower electrode can be primarily heat-treated during the formation of the lower electrode such that the surface of the metal layer is changed. Then, a second heat treatment is performed after the deposition of a dielectric layer. Thus, the metal layer that is subjected to the primary heat treatment may be changed less in the second heat treatment compared to a metal layer that is subjected to only the second heat treatment subsequent to the deposition of a dielectric layer. Thus, it is possible to reduce or prevent the dielectric layer from being cracked due to the heat treatment subsequent to the formation of the dielectric layer.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A method for manufacturing an integrated circuit capacitor comprising:
   forming a first metal layer on an integrated circuit substrate;
   forming hemispherical grain lumps by heat-treating the first metal layer in a nitrogen atmosphere;
   forming a dielectric layer on the hemispherical grain lumps opposite the integrated circuit substrate; and
   forming a second metal layer on the dielectric layer opposite the first metal layer.

2. The method of claim 1, wherein the first metal layer and the hemispherical grain lumps comprise at least one of Pt, Ru, Rh, Ir, Os and Pd.

3. The method of claim 1, wherein the heat-treating is performed in a nitrogen atmosphere at between about 500° C. and about 800° C.

4. The method of claim 1, wherein the hemispherical grain lumps vary in size depending on the thickness of the first metal layer and the time duration and/or temperature of the heat-treating.

5. A The method of claim 1, wherein the forming the first metal layer comprises forming a first metal portion on the integrated circuit substrate and forming a second metal portion on the first metal portion, wherein the first and second metal portions comprise different metals.

6. The method of claim 5, wherein the first metal portion comprises at least one of TiN, Ti and TaN.

7. The method of claim 5, wherein the second metal portion comprises at least one of Pt, Ru, Rh, Os, Ir and Pd.

8. The method of claim 5, the second metal portion is more readily oxidized than the first metal portion under same oxidizing conditions.

9. The method of claim 8, wherein the first metal portion comprises Pt, and the second metal portion comprises at least one of Ru, Rh, Os, Ir and Pd.

10. The method of claim 1, wherein the forming the first metal layer comprises forming a first metal portion on the integrated circuit substrate and forming a second metal portion on the first metal portion opposite the integrated circuit substrate, the first and second metal portions comprising different metals, and wherein the first metal portion retains its surface morphology during a heat treatment subsequent to the formation of the second metal portion.

11. A The method of claim 10, wherein the forming the first metal portion comprises forming the first metal portion on the integrated circuit substrate and exposing the first metal portion to plasma containing argon (Ar), oxygen ($O_2$) and/or nitrogen ($N_2$).

12. The method of claim 10, wherein the forming the first metal portion further comprises:
   forming a capping layer on the first metal portion opposite the integrated circuit substrate;
   heat-treating the first metal portion covered with the capping layer;
   removing the capping layer; and
   plasma-treating the first metal layer which is exposed.

13. The method of claim 12, wherein the heat-treating is performed in a nitrogen atmosphere at between about 500° C. and about 800° C.

14. The method of claim 13, wherein plasma containing argon (Ar), oxygen ($O_2$) and/or nitrogen ($N_2$) is used in the plasma-treating.

15. The method of claim 1, further comprising forming a layer comprising an oxide of the first metal layer between forming the first metal layer and the heat-treating; and
   wherein the hemispherical grain lumps are formed to protrude from the metal oxide layer.

16. The method of claim 15, wherein the first metal layer comprises at least one of Pt, Ru, Rh, Os, Ir, and Pd.

17. A method for manufacturing an integrated circuit capacitor comprising:
   forming a first metal layer on an integrated circuit substrate;
   exposing the first metal layer to plasma containing oxygen ($O_2$);
   forming hemispherical grain lumps by heat-treating the first metal layer in an oxygen atmosphere;
   forming a dielectric layer on the hemispherical grain lumps opposite the integrated circuit substrate; and
   forming a second metal layer on the dielectric layer opposite the first metal layer.

18. The method of claim 17, wherein the first metal layer comprises at least one of Ru, Rh, Os, Ir, and Pd.

19. The method of claim 17, wherein the heat-treating is performed in an oxygen atmosphere at between about 500° C. and about 800° C.

20. A method for manufacturing an integrated circuit capacitor comprising:
   forming hemispherical grain lumps comprising metal and/or metal oxide on an integrated circuit substrate;
   conformally forming a metal oxide on the hemispherical grain lumps opposite the integrated circuit substrate, so as to maintain a profile of the hemispherical grain lumps;
   forming a dielectric layer on the hemispherical grain lumps opposite the integrated circuit substrate; and
   forming a metal layer on the dielectric layer, opposite the hemispherical grain lumps.

21. The method of claim 20, wherein the forming hemispherical grain lumps comprises forming a first metal layer on the integrated circuit substrate and heat-treating the first metal layer.

22. The method of claim 21, wherein the heat-treating the first metal layer is performed in an oxygen and/or nitrogen atmosphere.

23. The method of claim 21, wherein the heat-treating the first metal layer is performed in an oxygen atmosphere at a temperature between about 500° C. and about 800° C.

24. The method of claim 23, wherein the first metal layer comprises at least one of Ru, Rh, Os, Ir, and Pd, and the hemispherical grain lumps comprise an oxide of the metal layer.

25. The method of claim 22, wherein the heat-treating the first metal layer is performed in a nitrogen atmosphere at between about 500° C. and about 800° C.

26. The method of claim 25, wherein the first metal layer and the hemispherical grain lumps comprise at least one of Pt, Ru, Rh, Ir, Os, and Pd.

27. The method of claim 21, further comprising forming a capping layer on the first metal layer prior to heat-treating the first metal layer, and removing the capping layer after heat-treating the first metal layer.

* * * * *

UNITED STATES PATENT AND TRADEMARK OFFICE
CERTIFICATE OF CORRECTION

PATENT NO.     : 6,677,217 B2
DATED          : January 13, 2004
INVENTOR(S)    : Joo et al.

It is certified that error appears in the above-identified patent and that said Letters Patent is hereby corrected as shown below:

Column 11,
Line 38, should read -- 3. The method of claim 2, wherein the heat-treating is --

Signed and Sealed this

Twenty-second Day of June, 2004

JON W. DUDAS
*Acting Director of the United States Patent and Trademark Office*